US012658865B2

(12) United States Patent
Hande et al.

(10) Patent No.: US 12,658,865 B2
(45) Date of Patent: Jun. 16, 2026

(54) SYSTEM AND METHOD FOR REDUCTION IN POWER SUPPLY RAIL PUMPING IN CLASS D AUDIO AMPLIFIERS USING DUAL REGULATED DC-DC CONVERTERS

(71) Applicant: HARMAN PROFESSIONAL, INC., Northridge, CA (US)

(72) Inventors: Abhiman Ananthakrishna Hande, Plano, TX (US); Mark Edward Sieber, Wylie, TX (US)

(73) Assignee: HARMAN PROFESSIONAL, INC., Northridge, CA (US)

( * ) Notice: Subject to any disclaimer, the term of this patent is extended or adjusted under 35 U.S.C. 154(b) by 475 days.

(21) Appl. No.: 18/251,621

(22) PCT Filed: Nov. 4, 2020

(86) PCT No.: PCT/US2020/058836
§ 371 (c)(1),
(2) Date: May 3, 2023

(87) PCT Pub. No.: WO2022/098348
PCT Pub. Date: May 12, 2022

(65) Prior Publication Data
US 2023/0402977 A1    Dec. 14, 2023

(51) Int. Cl.
*H03F 3/217*    (2006.01)
*H02M 1/42*    (2007.01)
(Continued)

(52) U.S. Cl.
CPC ........ *H03F 3/2173* (2013.01); *H02M 1/4208* (2013.01); *H02M 3/33569* (2013.01); *H03F 3/183* (2013.01); *H03F 2200/03* (2013.01)

(58) Field of Classification Search
CPC .... H03F 3/2173; H03F 3/183; H03F 2200/03; H03F 3/2171; H02M 1/4208;
(Continued)

(56) References Cited

U.S. PATENT DOCUMENTS

| | | | | |
|---|---|---|---|---|
| 7,839,215 B2* | 11/2010 | Mendenhall | .......... | H03F 3/2171 |
| | | | | 330/297 |
| 9,013,239 B2* | 4/2015 | Buono | ................. | H02M 3/285 |
| | | | | 330/297 |

(Continued)

FOREIGN PATENT DOCUMENTS

| | | |
|---|---|---|
| GB | 2475633 A | 5/2011 |
| JP | 2006320159 A | 11/2006 |

(Continued)

*Primary Examiner* — Hieu P Nguyen
(74) *Attorney, Agent, or Firm* — Brooks Kushman, P.C.

(57) ABSTRACT

An amplifier system may include at least one alternating current (AC) input source, a first DC-DC converter configured to convert the AC voltage to a first rail voltage, a second DC-DC converter configured convert the AC voltage to a second rail voltage, and a Class D amplifier configured to receive the first rail voltage on a first positive rail from the first DC-DC converter and the second rail voltage on a second negative rail from the second DC-DC converter to reduce rail pumping of the first and second voltage rails.

13 Claims, 6 Drawing Sheets

(51) Int. Cl.
    *H02M 3/335*        (2006.01)
    *H03F 1/42*         (2006.01)
    *H03F 3/183*       (2006.01)

(58) Field of Classification Search
    CPC ........... H02M 3/33569; H02M 1/0074; H02M
               1/0077; H02M 3/01; H02M 3/33571;
                           H02M 1/007
    USPC ....................................... 330/10, 207 A, 251
    See application file for complete search history.

(56)                  References Cited

U.S. PATENT DOCUMENTS

| | | | |
|---|---|---|---|
| 9,602,011 | B1 | 3/2017 | Baker |
| 2014/0070885 | A1 | 3/2014 | Frium |
| 2017/0201217 | A1 | 7/2017 | Waller, Jr. |
| 2017/0324321 | A1 | 11/2017 | Heyerby |
| 2019/0238107 | A1 | 8/2019 | Heyerby |
| 2019/0246223 | A1 | 8/2019 | Larsen et al. |

FOREIGN PATENT DOCUMENTS

| | | |
|---|---|---|
| JP | 4718237 B2 | 7/2011 |
| JP | 2012023835 A | 2/2012 |
| JP | 2013027301 A | 2/2013 |
| JP | 2014217153 A | 11/2014 |
| JP | 2017147824 A | 8/2017 |

* cited by examiner

SYSTEM AND METHOD FOR REDUCTION IN POWER SUPPLY RAIL PUMPING IN CLASS D AUDIO AMPLIFIERS USING DUAL REGULATED DC-DC CONVERTERS

CROSS-REFERENCE TO RELATED APPLICATIONS

This application is the U.S. National Phase of PCT Application No. PCT/US2020/058836 filed on Nov. 4, 2020, the disclosure of which is hereby incorporated in its entirety by reference herein.

TECHNICAL FIELD

Disclosed herein are systems and methods for power supply rail pumping reduction in Class D audio amplifiers using dual regulated dc-dc converters.

BACKGROUND

Class D amplifiers operate as switching amplifiers wherein the switches are either on or off, as opposed to Class A, A/B, or B amplifier designs that have longer periods of time during which the switches are operated in the linear region where the output devices have higher power dissipation. Because Class D amplifiers switch the output devices between the off and on states, they dissipate much less power compared to other amplifier designs.

Class D amplifiers with single ended output loads and split voltage rails face a phenomenon called power supply "rail pumping" (or "bus pumping") during operation at low frequency and high power, especially when driving low impedance loads. This phenomenon results in the Class D power supply voltage rails increasing in magnitude. The higher power supply voltage rails result in additional losses and electrical stresses on the Class D amplifier semiconductors. Capacitors and semiconductors with higher voltage ratings are therefore used which adds cost to the system. Additionally, the higher the semiconductor voltage ratings, the slower their switching speed, resulting in additional losses. The overall losses increase with lower audio frequency, higher power operation, and increased number of audio channels.

SUMMARY

An amplifier system may include at least one alternating current (AC) input source, a first DC-DC converter configured to convert the AC voltage to a first rail voltage, a second DC-DC converter configured convert the AC voltage to a second rail voltage, and a Class D amplifier configured to receive the first rail voltage on a first positive rail from the first DC-DC converter and the second rail voltage on a second negative rail from the second DC-DC converter to reduce rail pumping of the first and second voltage rails.

A Class D audio amplification system may include at least one AC input source, a first DC-DC converter configured convert the AC voltage to regulate a positive voltage rail, a second DC-DC converter configured convert the AC voltage to regulate a negative voltage rail, a Class D amplifier configured to receive the positive voltage rail from the first DC-DC converter and the negative voltage rail from the second DC-DC converter to reduce rail pumping of the Class D amplifier.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like-referenced numerals designate corresponding parts throughout the different views.

DETAILED DESCRIPTION

Figure 1:
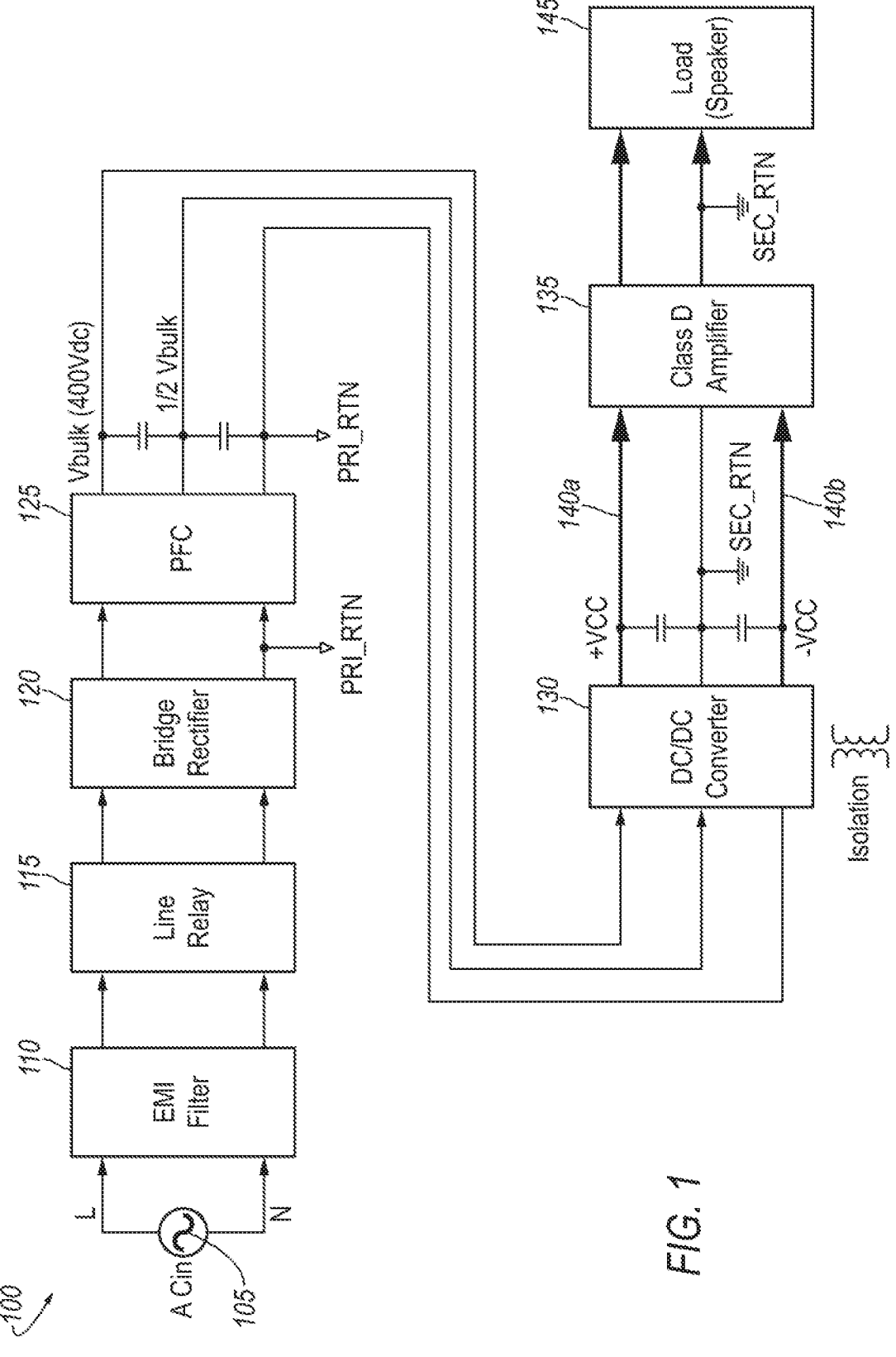
FIG. 1 illustrates an example system diagram for a Class D amplifier system.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Class D amplifiers operate as switching amplifiers wherein the switches are either on or off, as opposed to Class A, A/B, or B amplifier designs that have longer periods of time during which the switches are operated in the linear region where the output devices have higher power dissipation. Specifically, Class D amplifiers may deliver constantly changing voltage to a fixed load in the form of rectangular pulses. Pairs of transistors are used in the Class D amplifier in half bridge or full bridge configuration, and each pair is prevented from conducting simultaneously so as to prevent any short circuit of the power supply voltage rails. Due to the switching of the transistors from on and off, very little power is dissipated from the transistors, leading to higher efficiencies in Class D amplifiers.

Class D amplifiers with single ended outputs and split power supply voltage rails (i.e. positive and negative voltage rails), source current from the positive voltage rail during the positive half cycle of audio signal and sink current to the negative voltage rail during the negative half cycle of the audio signal. During such operation, a phenomenon called power supply "rail pumping" or "bus pumping" may occur. This rail pumping issue is especially prevalent during operation at low frequency, high output power (current) conditions, especially when driving low impedance loads. These conditions may result in the amplifier power supply voltage rails increasing in voltage magnitude. That is, the voltage rails may be "pumped" beyond their normal values. The higher power supply voltage rails result in additional losses and electrical stresses on the Class D amplifier semiconductors. Capacitors and semiconductors with higher voltage ratings are therefore required which adds cost to the system. Additionally, the higher the semiconductor voltage ratings, the slower their switching speed, resulting in additional losses and may lead to device overheating. The overall losses increase with lower audio frequency, higher power operation, and increased number of audio channels.

Traditionally, to obviate the effects of rail pumping on Class D amplifiers, additional capacitors are added to the power supply voltage rails. Another method involves use of a bidirectional power supply that enables reverse current flow from its output to its input thus, minimizing rail pumping. Also, semiconductors with higher voltage ratings may be used to account for the increased power supply voltage rails. However, these higher rated components may lead to lower switching speeds, resulting in additional losses. Further, adding additional capacitors to the power supply voltage rails may increase cost, as well as take up real estate on the printed circuit board (PCB). These added capacitors may require special attention to address potential safety issues during short circuits.

Other remedies for rail pumping may include bridging the output signals. The output signals are out of phase with respect to each other and therefore the power supply pumping in one channel cancels the pumping in the other channel. In multi-channel amplifiers, two channels may be operated out of phase from each other. Thus, any rail pumping that occurs in one channel may cancel the pumping in the other channel. However, for such a remedy the audio connection at the second channel terminal would need to be of an opposite polarity with respect to the first channel to push the inverted signal back into phase as in the first channel. Thus, a more general cost-effective approach to rail pumping and decreased amplifier efficiencies remains an issue for Class D amplifiers. Moreover, the overall losses increase with lower audio frequencies, higher power operation, and increased number of audio channels.

Disclosed herein is a dual regulated system having two separate regulated direct current (DC)-DC converters to generate the amplifier voltage rails. One of the converters regulates the positive supply voltage rail (+VCC), while the other regulates the negative supply voltage rail (−VCC). By regulating each of the voltage rails, the rail pumping effect is reduced significantly, as is the need for additional capacitors on the secondary side. Using two smaller regulated DC-DC power supplies instead of a single larger unregulated power supply, allows for a simplified layout and facilitates a better thermal design without compromising size and cost.

FIG. 1 illustrates an example system diagram for a Class D amplifier system 100. The system 100 may include an alternating current (AC) to direct current (DC) power supply that receives power from an AC source 105. An electromagnetic interference (EMI) filter 110 may receive power from the AC source 105. The EMI filter 110 may suppress electromagnetic noise generated by the various power supply circuits in the system. This may be especially important since high-frequency components of Class D amplifiers tend to generate spurious EMI that may disrupt operation of other components, circuits, and systems.

The system 100 may include a line relay 115 configured to receive the filtered AC input from the EMI filter 110. The line relay 115 may provide the filtered AC input to a bridge rectifier 120. The line relay 115 may provide the filtered AC input to the rectifier 120. The rectifier 120 may then convert the AC voltage input to full wave rectified DC voltage output.

A power factor correction (PFC) circuit 125 may receive the full wave rectified DC voltage. The PFC circuit 125 may perform PFC so that the input current is in phase with the input voltage resulting in a close to unity power factor. The PFC circuit 125 may also reduce line harmonics, distortion and peak currents.

A DC-DC converter 130 may receive the power factor corrected DC power. The converter 130, as explained above, is typically a single isolated and unregulated DC/DC converter that supplies +/−VCC voltage rails (e.g., a first positive voltage rail (+VCC) 140a and a second negative voltage rail (−VCC) 140b) to the Class D amplifier 135. The amplifier 135 then provides the power to the load 145 or speaker for playback. Typical converters 130 may include DC/DC converter topologies such as LLC (half-bridge, full-bride), phase shifted full bridge, dual active bridge, etc.

Figure 2:
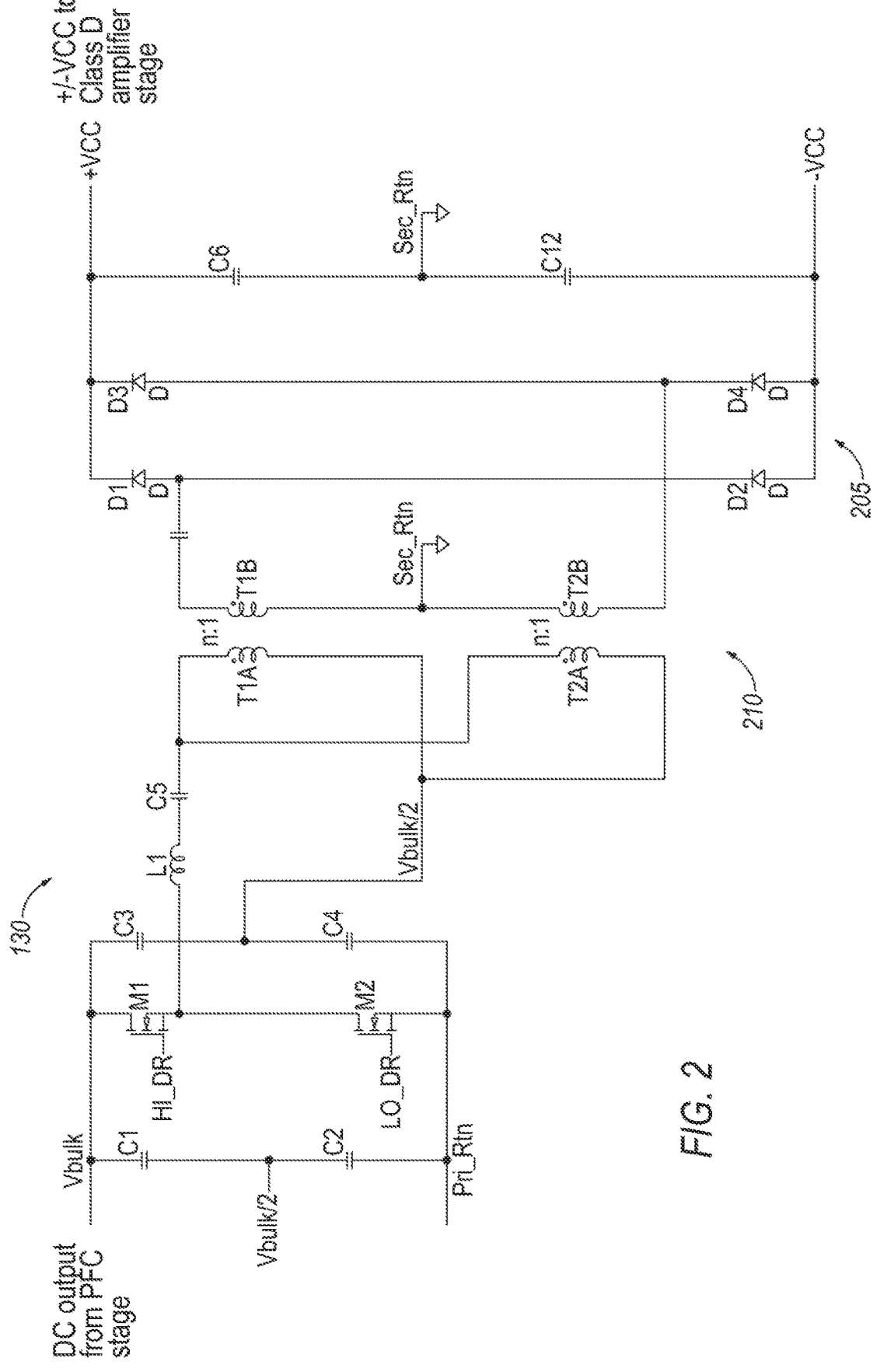
FIG. 2 illustrates an example schematic of a portion of the Class D amplifier system of FIG. 1.

FIG. 2 illustrates an example DC-DC converter 130. In the example shown, the converter is a single unregulated converter, specifically a half bridge LLC converter. The output may include at least one pair of diodes 205 that prevent reverse current flow. These diodes contribute to the rail pumping phenomenon described before. For example, during the positive half cycle of output audio signal, the bottom two diodes, D2 and D4 block reverse current flow. This results in negative voltage rail capacitor C12 to overcharge. Similarly, during the negative half cycle of output audio signal, the top two diodes D1 and D3 block reverse current flow. This results in positive voltage rail capacitor C6 to overcharge. This example illustrates a half bridge LLC converter 210, but other example DC/DC converters may be used.

Figure 3:
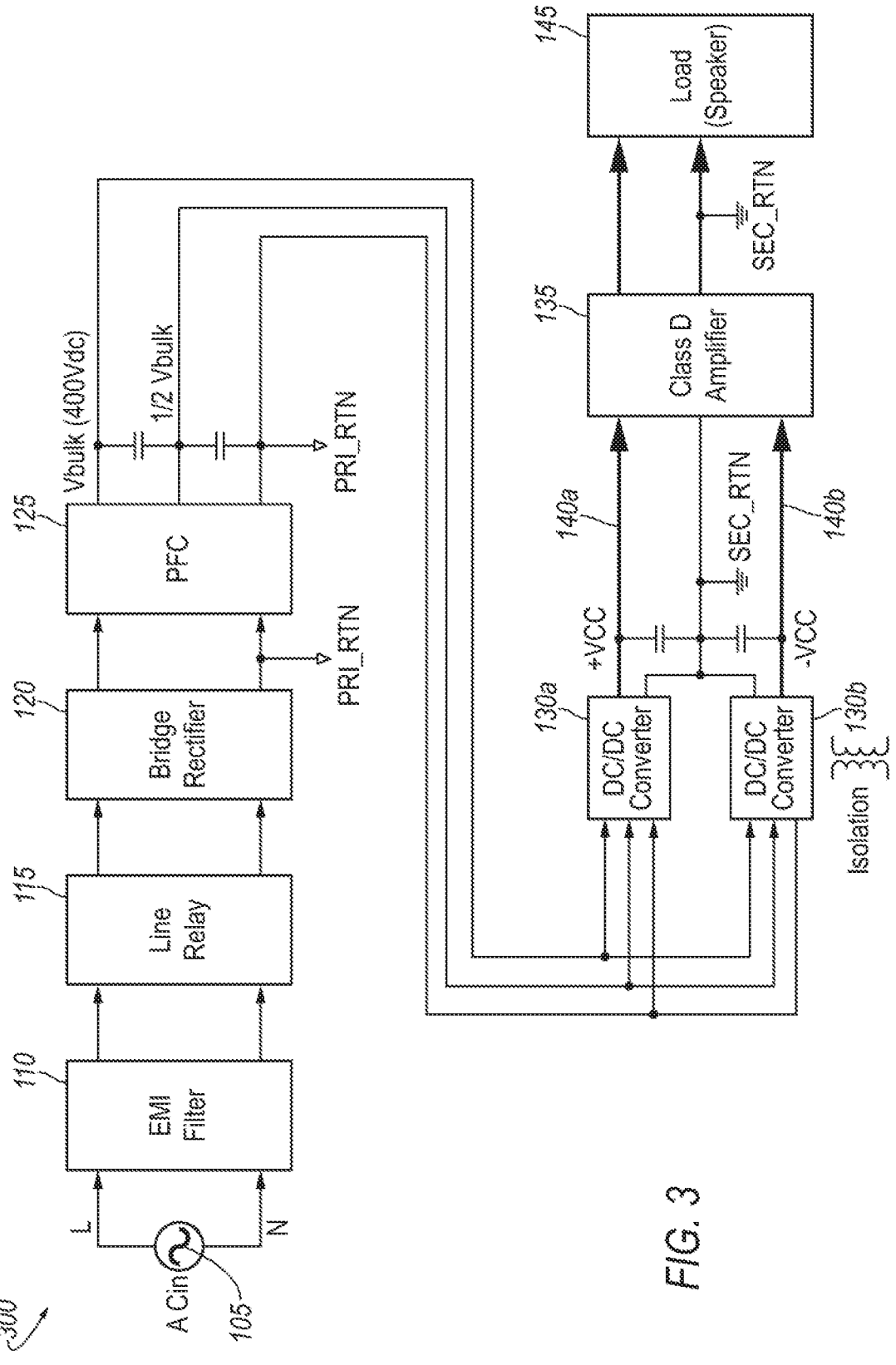
FIG. 3 illustrates an example system diagram for another Class D amplifier system.

FIG. 3 illustrates another example system diagram for a Class D amplifier system 300 having dual regulated DC/DC converters 130a, 130b. FIG. 3 may include components similar to those of FIG. 1, including an AC-DC power supply that receives power from an AC source 105, an EMI filter 110 configured to suppress electromagnetic interference signals, and a line relay 115 configured to receive the filtered AC input from the EMI filter 110. A rectifier 120 may then convert the filtered AC input voltage to full wave rectified DC output voltage and a PFC circuit 125 may perform power factor correction.

Unlike the example in FIG. 1, the system 300 may implement a dual regulated DC/DC converter. Each converter may regulate the +VCC voltage rail and the −VCC voltage rail respectively. As shown, a first converter 130a is included for the first positive voltage rail (+VCC) 140a, and a second converter 130b is included for the second negative voltage rail (−VCC) 140b. As explained above, by regulating each of the voltage rails separately, the power supply rail pumping effect is reduced significantly, as is the need for additional capacitors on the secondary side. Such regulation of the voltage rails also allows for a simplified layout and facilitates a better thermal design without compromising size and cost.

Figure 4:
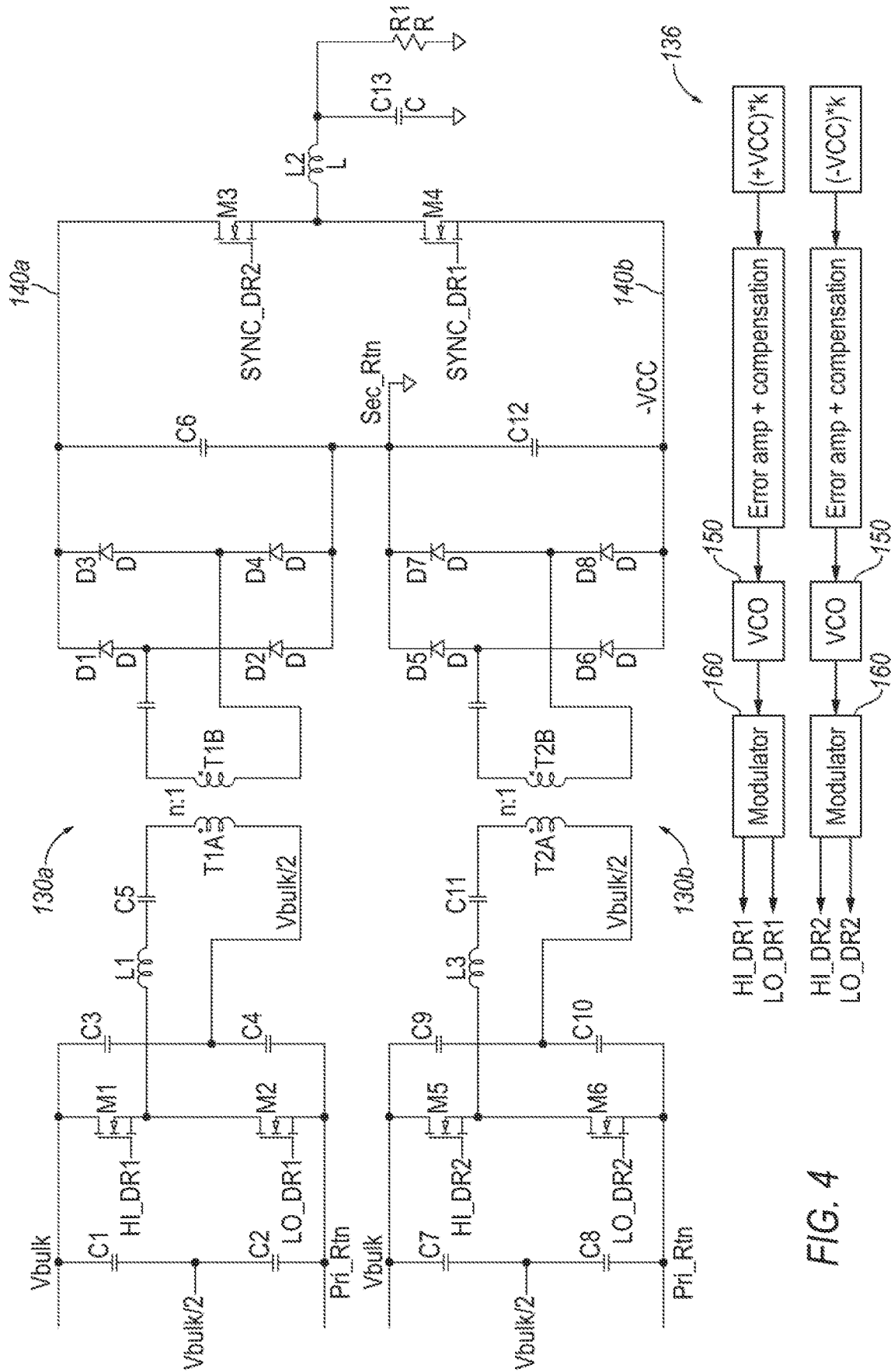
FIG. 4 illustrates an example schematic of a portion of the Class D amplifier system of FIG. 3.

FIG. 4 illustrates another example schematic for the dual converters 130a, 130b of FIG. 3. The DC power input may be received by each of the converters 130a, 130b from the PFC circuit 125. The PFC circuit 125 may provide a bulk voltage ($V_{bulk}$) to each converter 130a, 130b. The converters 130a, 130b may then regulate this input so that each voltage rail 140a, 140b is separately regulated. The first converter 130a and the second converter 130b are illustrated as half bridge LLC converters, but may be any other topology (such as a full-bride, phase shifted full bridge, dual active bridge, etc. as mentioned above). The first converter 130a may regulate the DC voltage of the first voltage rail 140a (+VCC) and the second converter 130b may regulate the DC voltage of the second voltage rail 140a (−VCC). The Class D amplifier 135 may then receive the first and second voltage rails 140a, 140b.

The LLC DC/DC converter 130 requires pulse frequency modulation to modulate the switching frequency to regulate its output voltage. A converter feedback circuit 136 may scale down the +VCC and −VCC voltage rail values with a constant k and apply the signal to an error amplifier with frequency compensation network. The converter feedback 136 may include a voltage controlled oscillator (VCO) 150 that uses the error amplifier output to determine the switching frequency of each LLC DC/DC converter.

The converter feedback 136 may include a modulator 160 for implementing pulse frequency modulation to output a series of pulses. The example of the LLC DC/DC converter 130 shown employs pulse frequency modulation to regulate the voltage rail voltages. In other topologies such as half bridge, full bridge, phase shifted full bridge, etc., pulse-width modulation (PWM) is used to regulate the output voltage. The HI DR and LO DR signals may be the controlling gate signals for a MOSFET or IGBT transistor.

Class D amplifiers may be a cost-effective component for use in audio systems. As such, mitigating power supply rail pumping may be beneficial and increase the ability to efficiently use Class D amplifiers. By reducing rail pumping by separately controlling the voltage on each voltage rail, the Class D amplifier may perform more efficiently, with less stress and less heat, thus leading to overall improvements of the overall audio system.

Figure 5:
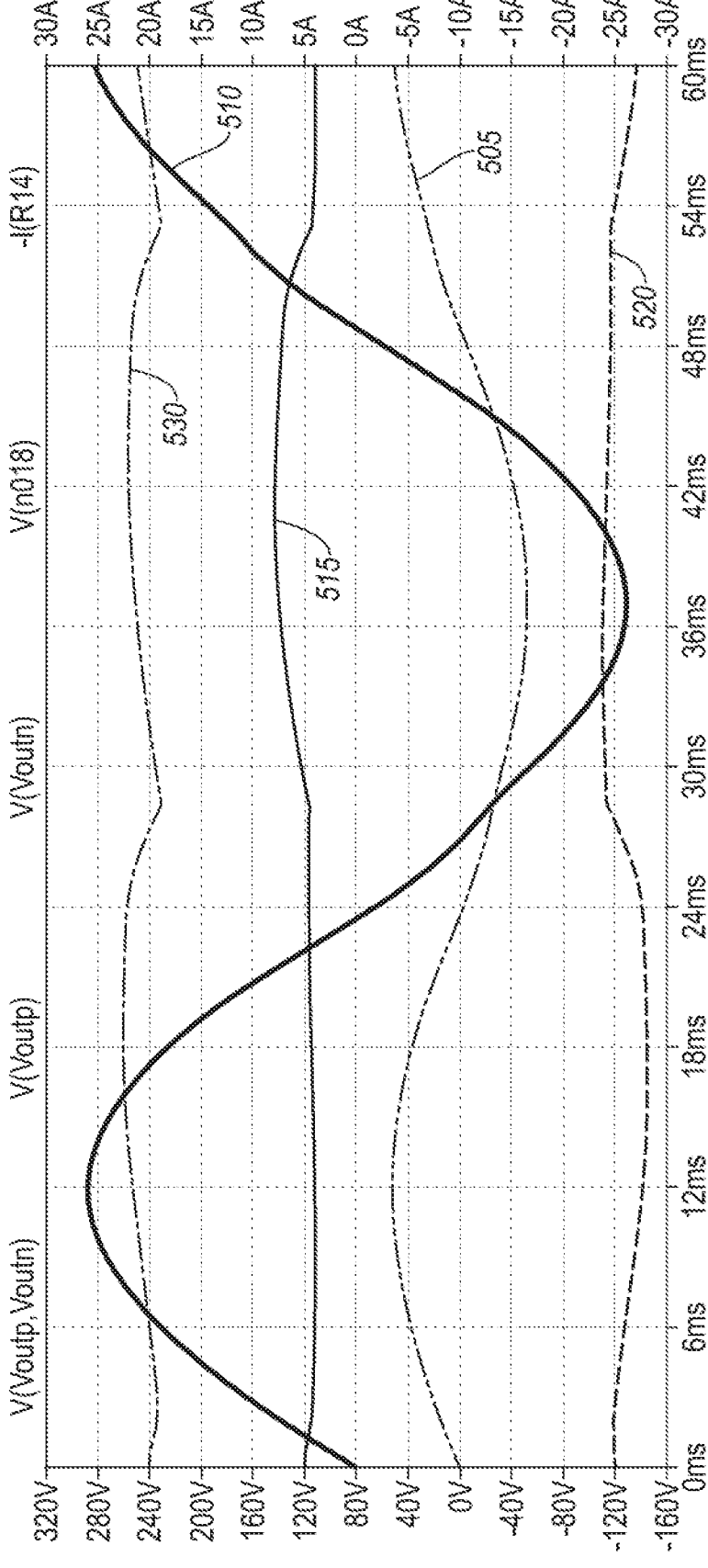
FIG. 5 illustrates an example chart illustrating voltages of the Class D amplifier system of FIG. 1.

FIG. 5 illustrates an example chart illustrating voltages and currents of the Class D amplifier system 100 of FIGS. 1 and 2 where an unregulated unidirectional DC-DC converter is used. The Class D amplifier outputs a voltage 505 which has a peak value of about 50V at a frequency of to a 2 ohm speaker load (resistor R1 shown in FIG. 4). The corresponding current 510 has a peak value of about 25 A at a frequency of 20 Hz taken at resistor R1 of FIG. 4.

The chart shows a first rail voltage 515 at the positive voltage rail 140a. As illustrated, the positive rail voltage 515 remains generally constant at approximately 120V during the positive half cycle of audio voltage/current output. During the negative cycle of audio output, the positive rail voltage starts to increase in magnitude due to the rail pumping phenomenon. A second rail voltage 520 at the negative voltage rail 140b may have a similar trend as the first rail voltage 515 in that the voltage may increase in magnitude during the positive half cycle of audio voltage/current output followed by a generally constant magnitude at approximately −120V thereafter. A voltage difference 530 is illustrated to show the difference between the +VCC and −VCC. In this example the +VCC may have a maximum value of 145V and the −VCC may have a maximum value of −145V. The (+VCC)— (−VCC) difference may equal 260V. Further, in this example, 3 mF was used on each voltage rail (i.e. 3 mF on the +VCC voltage rail and 3 mF on the −VCC voltage rail).

Figure 6:
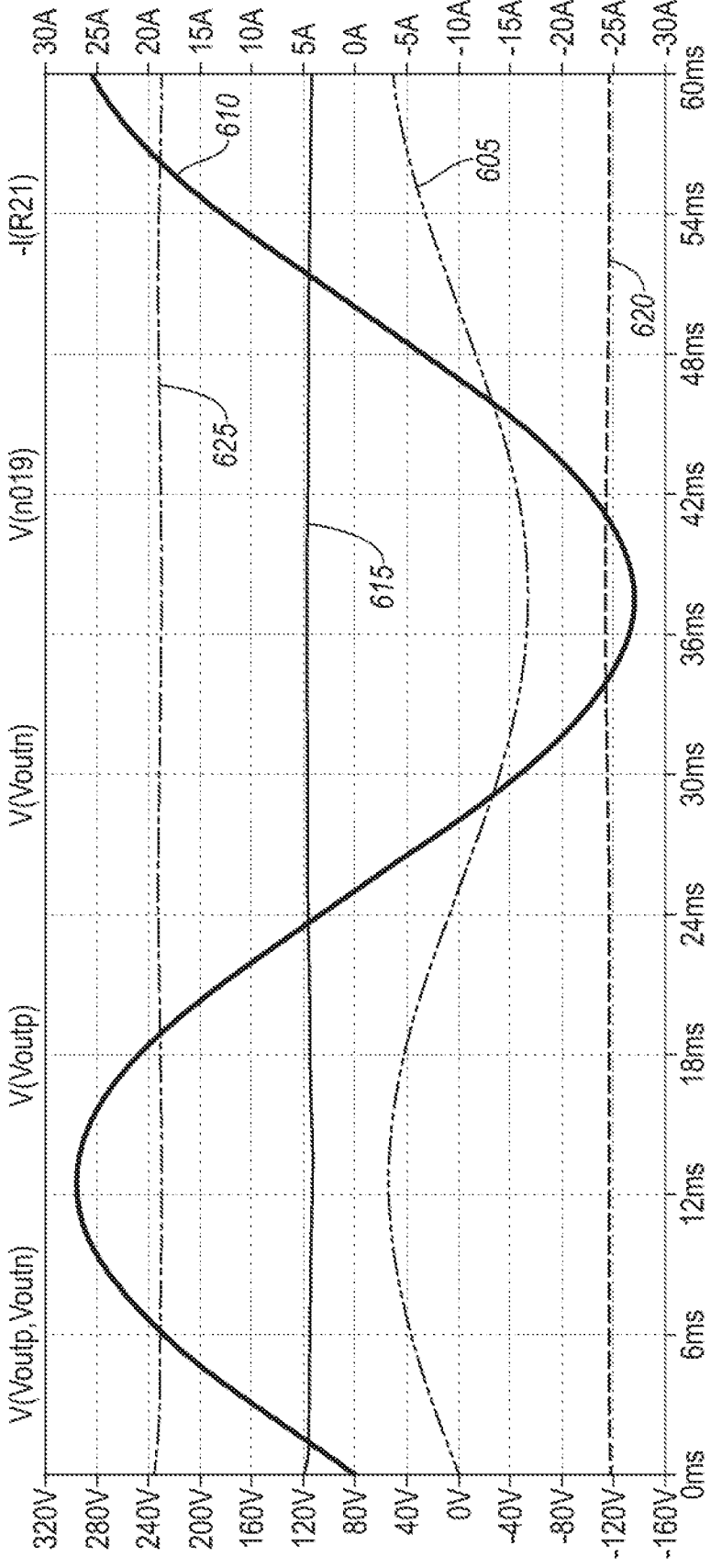
FIG. 6 illustrates an example chart illustrating voltages of the Class D amplifier system of FIG. 3.

FIG. 6 illustrates an example chart illustrating voltages of the Class D amplifier system 300 of FIGS. 3 and 4 where the system 300 includes dual regulated power supplies. Similar to the chart in FIG. 5, an amplifier voltage 605 is taken at capacitor C13 of FIG. 4. In this example, the amplifier voltage 605 may be with a 2 ohm load. As illustrated in the example chart, the amplifier voltage 605 outputs a voltage 605 which has a peak value of about 50V at a frequency of 20 Hz to a 2 ohm speaker load (resistor R1 shown in FIG. 4). The corresponding current 610 has a peak value of about 25 A at a frequency of 20 Hz taken at resistor R1 of FIG. 4.

The chart shows a first rail voltage 615 at the positive voltage rail 140a. Unlike the positive rail voltage 515 of FIG. 5, the positive rail voltage 615 in FIG. 6 remains generally constant at approximately 120V. A second rail voltage 620 at the negative voltage rail 140b may have a similar trend and remain constant at approximately −120V. A voltage difference 625 is illustrated to show the difference between the +VCC and +VCC. In this example the +VCC may have a maximum value of about 118V and the −VCC may have a maximum value of about −117V. The (+VCC)—(−VCC) may equal about 232V. Thus, the specific voltages on each voltage rail are relatively constant and rail pumping phenomenon is mitigated significantly. These voltages 615, 620 are relatively constant and significantly lower than those of the examples in FIG. 5 where the power supplies to the Class D amplifier exhibit rail pumping. Further, in this example, lesser capacitance equal to 1.5 mF was used on each voltage rail (i.e. 1.5 mF on the +VCC voltage rail and 1.5 mF on the −VCC voltage rail).

Accordingly, the use of dual regulated DC-DC converter approach helps reduce Class D amplifier rail pumping by separately regulating the positive and negative amplifier voltage rails. The lower amplifier voltage supply rail peaks result in reduction of losses and electrical (overvoltage, switching loss) stresses on the Class D amplifier semiconductors. Capacitors and semiconductors with lower voltage ratings can therefore be used which helps reduce system cost. Also, use of lower voltage rating semiconductors means relatively faster switching speeds resulting in lower losses and improved efficiency. Overall losses decrease significantly with lower audio frequency, higher power operation, and increased number of audio channels.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable.

The flowcharts and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An amplifier system, comprising:
at least one alternating current (AC) input source;
a first DC-DC converter configured to convert the AC voltage to a first rail voltage;
a second DC-DC converter configured convert the AC voltage to a second rail voltage;
a Class D amplifier configured to receive the first rail voltage on a first positive rail from the first DC-DC converter and the second rail voltage on a second negative rail from the second DC-DC converter to reduce rail pumping of the first and second voltage rails; and

a power factor correction circuit configured to apply power factor correction to the AC input prior to DC/DC power conversion and application of DC power to the first and second DC-DC converters.

2. The system of claim 1, further comprising at least one speaker configured to receive an amplified signal from the Class D amplifier.

3. The system of claim 1, wherein at least one of the first or second DC-DC converters is a half bridge LLC converter.

4. The system of claim 1, wherein at least one of the first or second DC-DC converters is a full bridge LLC converter.

5. The system of claim 1, wherein at least one of the first or second DC-DC converters is a dual active bridge converter.

6. The system of claim 1, wherein the DC-DC converter includes a feedback circuit having at least one voltage controlled oscillator.

7. The system of claim 6, wherein the feedback circuit includes at least one modulator configured output a series of pulse frequency modulation pulses.

8. A Class D audio amplification system, comprising:
at least one AC input source;
a first DC-DC converter configured convert the AC voltage to regulate a positive voltage rail;
a second DC-DC converter configured convert the AC voltage to regulate a negative voltage rail; and
a Class D amplifier configured to receive the positive voltage rail from the first DC-DC converter and the negative voltage rail from the second DC-DC converter to reduce rail pumping of the Class D amplifier, wherein the Class D amplifier includes at least one voltage controlled oscillator (VCO).

9. The system of claim 8, further comprising a power factor correction circuit configured to apply power factor correction to the AC input prior to DC/DC power conversion and application of DC power to the first and second DC-DC converters.

10. The system of claim 8, wherein at least one of the first or second DC-DC converters is a half bridge LLC converter.

11. The system of claim 8, wherein at least one of the first or second DC-DC converters is a full bridge LLC converter.

12. The system of claim 8, wherein at least one of the first or second DC-DC converters is a dual active bridge converter.

13. An amplifier system, comprising:
at least one alternating current (AC) input source;
a first DC-DC converter configured to convert the AC voltage to a first rail voltage;
a second DC-DC converter configured convert the AC voltage to a second rail voltage, wherein at least one of the first or second DC-DC converters is a dual active bridge converter; and
a Class D amplifier configured to receive the first rail voltage on a first positive rail from the first DC-DC converter and the second rail voltage on a second negative rail from the second DC-DC converter to reduce rail pumping of the first and second voltage rails.

* * * * *